May 26, 1953 M. ALDEN 2,640,185

RESILIENT SOLDER TERMINAL

Filed Nov. 25, 1950 3 Sheets-Sheet 1

Inventor
Milton Alden
by Roberts, Cushman & Grover
Att'ys

May 26, 1953 M. ALDEN 2,640,185

RESILIENT SOLDER TERMINAL

Filed Nov. 25, 1950 3 Sheets-Sheet 2

Inventor
Milton Alden
by Roberts, Cushman & Groves
Att'ys

May 26, 1953 M. ALDEN 2,640,185

RESILIENT SOLDER TERMINAL

Filed Nov. 25, 1950 3 Sheets-Sheet 3

Inventor
Milton Alden
by Roberts, Cushman & Grover
Att'ys

Patented May 26, 1953 2,640,185

UNITED STATES PATENT OFFICE 2,640,185

RESILIENT SOLDER TERMINAL

Milton Alden, Wellesley, Mass.

Application November 25, 1950, Serial No. 197,569

9 Claims. (Cl. 339—242)

This invention relates to electrical terminals and more particularly to terminals of the type to which the leads from electrical circuit components of electronic circuits such as resistors and capacitors are soldered.

The present solder terminals used in radio, television and electronic circuitry generally require that the leads from the circuit components be twisted or wrapped around the terminal to secure the leads during the soldering operation and to add to the mechanical strength of the soldered joint. The twisting of the individual leads adds materially to the time and the cost of labor required to wire electronic equipment which often may have hundreds or in complicated circuits thousands of soldered joints. Unless the twisting is carefully done, the leads may be broken away from the component or components otherwise damaged resulting in rejection of the equipment during test and inspection and further cost for repairs or salvage. Wrapped joints have the additional disadvantage of being difficult to unsolder without damage to the adjacent parts and components so that they add to the difficulty in servicing and repairing the equipment.

The so-called metal tie lugs and other similar terminals made from stampings and commonly used in cheaper equipment have been found to be not rigid enough to withstand the severe vibration and shock present in mobile equipment and other heavy duty apparatus. It is therefore customary to use terminals such as turret or split lugs in the wiring of high quality equipment and where dependability under severe operating conditions is a paramount consideration. The latter types of lugs are generally screw machine parts which are machined from bar stock so that they are strong and rigid. The comparatively large mass of material in the body of this type of lug results in a high thermal capacity so that to bring the joint between the lug and lead to soldering temperature requires both a hot soldering iron and a considerable time interval which increases both the labor required and the cost of wiring. Furthermore if the soldering is not carefully done, the heat conducted along the leads often damages components such as capacitors which contain wax. The difficulties encountered are further increased when more than one lead must be soldered to a single terminal. To minimize the possibility of damage by heating, it is customary to use longer leads than would be otherwise necessary thus separating the terminals further apart and increasing the space requirements. The latter terminals are also expensive to produce because of the machining required.

Objects of this invention are to provide a solder lug or terminal for electrical component leads, which saves space, which speeds production, which is readily manufactured by punch press operations, which terminal is strong and rigid, which secures the lead for the soldering operation without the necessity of wrapping or twisting, which permits the leads to be pre-trimmed, which has a low thermal capacity, which will secure several leads, which facilitates wiring of electronic equipment, which is light in weight, which is small in size, which can be adapted to be used with components of various diameters, which is economical to produce, and which lends itself to mass production techniques.

In a broad aspect the invention contemplates a soldering terminal comprising an elongated piece of conducting material having means at one end for fastening it to a terminal board or block which means may be, for example, a recessed portion adapted to be formed into an eyelet or otherwise spread upon the opposite side of a sheet of insulating material or molded in a suitable block. The opposite end of the elongated piece is bifurcated to form an aperture to receive the lead of an electrical component such as a resistor or capacitor of the conventional type used in electronic circuits which end is elastic and proportional so as to be deformed or yield as the lead is inserted thereby to secure the lead during the soldering operation without the necessity of twisting, wrapping or otherwise attaching the lead to the terminal. It is also preferable although not necessary that the tines forming the aperture for the lead be provided with aligned apertures or openings to receive a second lead, the openings being near the ends of the tines so that the second lead will lock the first lead in position.

In a more specific aspect the terminal comprises a strip of conducting material folded back upon itself so that its ends lie adjacent each other. Each of the ends is crowned outwardly or otherwise deformed to impart rigidity and to form a recess for facilitating the attachment of the terminal to a terminal board or strip. The folded portion of the strip is slotted lengthwise of the strip to form a slotted aperture for securing the lead. Additional rigidity is imparted by outwardly bending the portion of each strip between the fold and the crowned portion into two or more loops thereby to form a figure 8 or ogdoad. Preferably although not necessarily the diameter of the opening or aperture formed by at least one of the pair of loops is great enough to take a second lead.

The above terminals are adapted to receive leads from components of generally similar diameters, terminals of different sizes being employed when the component diameters vary considerably. However, by providing a terminal having a sufficient height to accommodate the component having the greatest diameter and a slotted aperture deep enough for the smallest component, it is possible by providing one or more notches or serrations in one or both sides of the slotted aperture to secure the leads from components of intermediate diameters. The aperture is preferably although not necessarily tapering inwardly so that the width of the bottom is less than that of the top.

These and other objects and aspects will be apparent from the following description of several specific embodiments of the invention referring to drawings in which.

Figure 5:
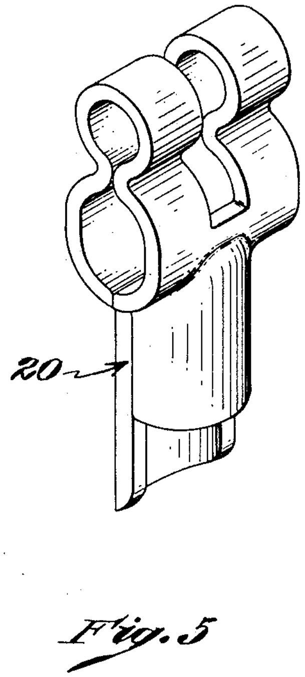
Fig. 5 is an enlarged isometric view of one embodiment of the invention.
Figure 6:
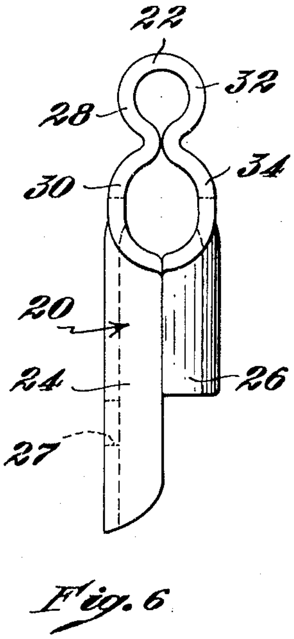
Figs. 6 and 7 are side elevation views of the embodiment shown in Fig. 5.
Figure 7:
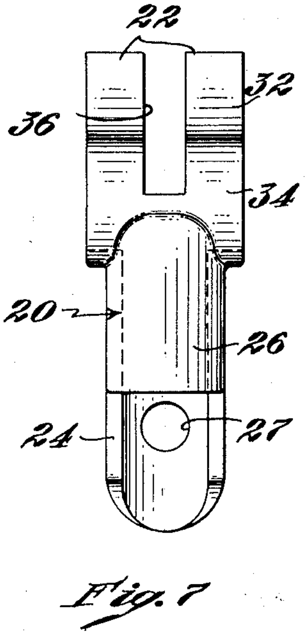

The first embodiment of the invention illustrated in Figs. 5 through 7 comprises a soldering lug or terminal 20 formed of a strip of conducting material such as soft brass or bronze folded back upon itself as at 22 so that the ends 24 and 26 of the strip are adjacent each other. The end 24 is extended beyond the end 26 and provided with an aperture 27 to form a tab for the attachment of a lead as described hereinafter. As is best shown in Fig. 6, the ends 24 and 26 are crowned outwardly which serves both to impart rigidity and stiffness to the terminal and to facilitate the forming of the eyelet for mounting the terminal as will be described in detail below.

The terminal 20 is further stiffened by bending the portion of the terminal side between the fold 22 and the beginning of the crown in the end 24 outwardly into two adjacent loops 28 and 30. Two similar loops 32 and 34 are formed in the portion of the other terminal side between the fold 22 and the crown of the end 26 so that the upper portion of the terminal has the appearance of an ogdoad or figure 8.

The loops 28—34 are bifurcated by a slotted aperture 36 (Fig. 7) which transversely cuts the fold 22 and extends axially of the terminal entirely through the loops 28 and 32 and approximately half way through the loops 30 and 34. The depth of slotted aperture 36 is made great enough so that when a wire or conducting lead is resting upon the bottom of the aperture the top thereof lies below the openings formed by the loops 28 and 32. The diameters of these openings are great enough so that a second lead can be inserted therein without interfering with the lead in the bottom of the slotted aperture. The width of the slotted apertre 36 is preferably although not necessarily slightly less than the diameter of the lead so that the lead will deform the tines on either side of the aperture as it is forced therein, thus securing the lead because of the restoring force exerted by the elasticity of the tines.

Figure 1:
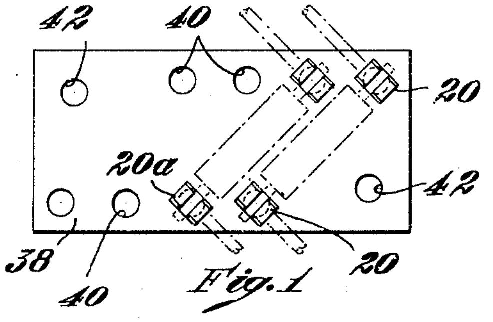
Fig. 1 is a plan view of a terminal strip showing one manner of mounting terminals according to the invention.
Figure 2:
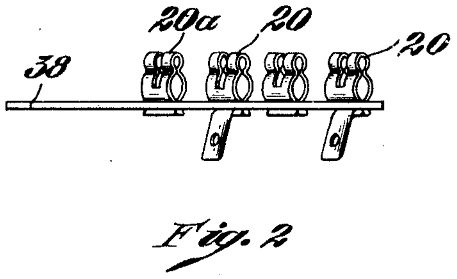
Fig. 2 is a side elevation of the terminal strip drawn in Fig. 1.

Although terminals 20 of the type described above can be mounted in the conventional manner so that the electrical component whose leads are soldered thereto is arranged transversely of the terminal board or strip, the preferable manner of arranging the terminals is shown in Figs. 1 and 2 wherein associated pairs of terminals are offset so that the axis of the electrical component secured thereby is disposed at approximately 45 degrees to the sides of the strip. The latter arrangement permits adjacent tie leads inserted in the openings formed by the loops 28 and 32 of juxtaposed terminals to be brought out at an angle without interfering with each other.

The terminals 20 are attached to the terminal board by inserting the crowned ends 24 and 26 in the corresponding holes 40 provided in the terminal strip 38. A pointed tool is then inserted in the recess formed by the crowning of the ends 24 and 26 to bend over the ends into an eyelet which secures the terminals to the strip. The strip 38 with the terminals attached as above is mounted upon the chassis or panel (not shown) by means of rivets or screws which project through mounting holes 42. When the chassis is wired the leads of all the components are inserted in the corresponding slotted apertures 36 and cut off immediately beyond the terminals, as shown in Fig. 1. It will be noted in this connection that the leads are secured by the elastic action of the terminal so that no twisting or bending of the leads is required thereby reducing the labor cost and the possibility of damage to the components. The tie leads are then inserted in the openings formed by the loops 24 and 26 which act to further secure the leads from the components.

After the wiring is completed, as described above, the joints are soldered. Because the stiffness and rigidity of terminals, constructed as described heretofore, results from their configuration rather than their mass, much less heat is required than with conventional terminals so that the soldering operation is completed more quickly and results in better joints. There is also less time for the heat to be conducted along the leads to damage such components as capacitors making it possible in many instances to shorten such leads with resulting material saving in space.

Figure 3:
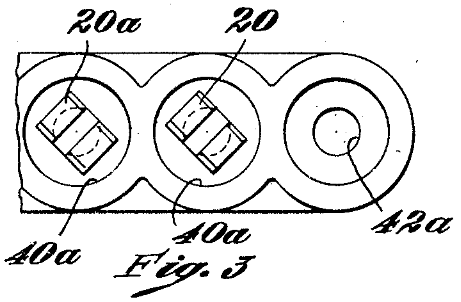
Fig. 3 is a plan view of a molded block having a plurality of terminals mounted thereupon.
Figure 4:
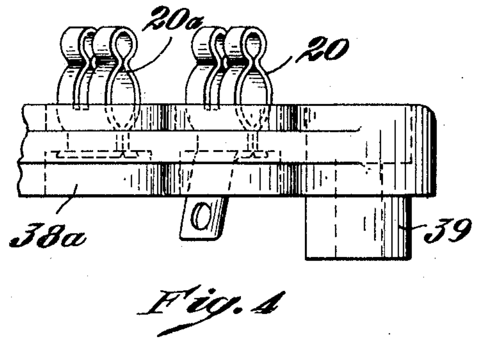
Fig. 4 is a side elevation view of the block shown in Fig. 3.

In Figs. 3 and 4 is shown a terminal block 38[a] molded from a suitable plastic and having a row of recesses 40[a] for accommodating a single row of terminals. Each recess 40a has a centrically located hole wherein a respective terminal is secured by an eyelet operation similar to that described in detail heretofore with respect to the terminal strip 38. The terminal blocks 38a are mounted in pairs by means of screws (not shown) which project through mounting holes (42a) in the end recesses in the blocks. An integral boss 39 is provided beneath each of the end recesses which act as spacers.

Figure 8:
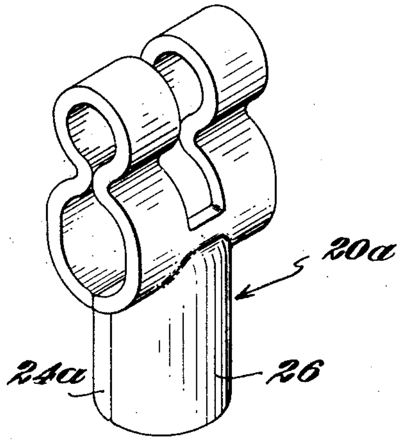
Fig. 8 is an isometric view of a second embodiment of the invention wherein the lower tab has been eliminated.

An alternative form of the terminal 20 designated 20a is shown in Fig. 8. The terminal 20a is identical in construction and used in a similar manner to the terminal 20 with the single exception that the bottom soldering tab is eliminated by making the crowned end 24a the same length as the end 26.

Figure 9:
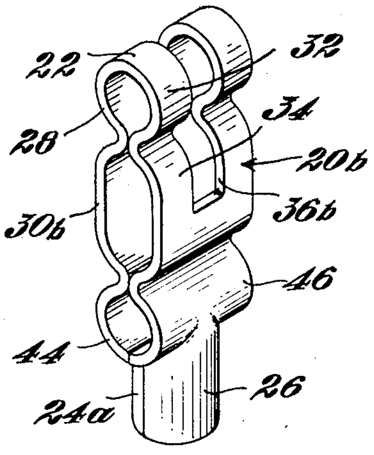
Fig. 9 is an enlarged isometric view of a third embodiment of the invention adapted to receive the lead from a large component.

The terminals 20 and 20a are designed for use with comparatively small diameter components, and it has been found advantageous to use with larger components a terminal 20b similar to that shown in Fig. 9. In the terminal 20b the bottom of the slotted aperture 36 is raised by increasing the length of the loops 30b and 34b and by inserting additional pairs of loops 44 and 46 between the loops 30b and 34b and the crowned ends 24a and 26, respectively. In other respects the terminal 20b is similar to the terminals 20 and 20a described heretofore.

It is also possible to construct, according to the above principles, universal terminals which will accommodate electrical components of various diameters. One of such terminals, which is designated 20c in Fig. 10, comprises a conducting strip folded at 22 and provided with crowned ends 24 and 26 and lower loops 30 and 34 which are similar to the elements of the terminal 20a bearing the same indicia and described in detail heretofore. The upper loops 28c and 34c are greatly elongated to increase the height of the terminal so that the slotted aperture 36c is not extended into the lower loops 30 and 34. The sides of the aperture 36c are provided with recesses or notches 50 which are offset from each other lengthwise of the aperture thereby to act as a series of stops to accommodate the leads from components of different diameters without the necessity of bending.

Figure 10:
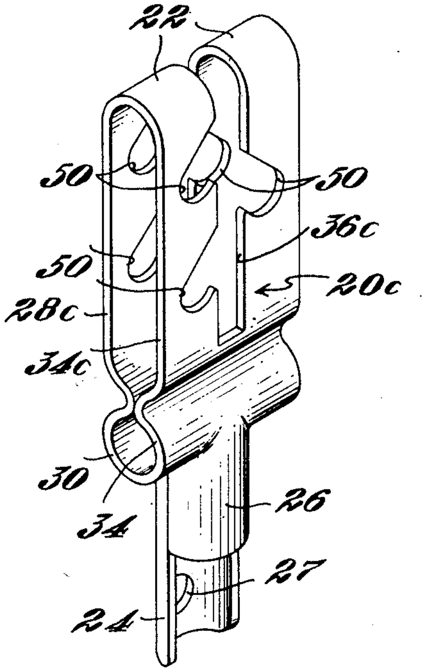
Fig. 10 is an enlarged isometric view of a fourth embodiment of the invention adapted to receive leads from components of various diameters.
Figures 11, 12:
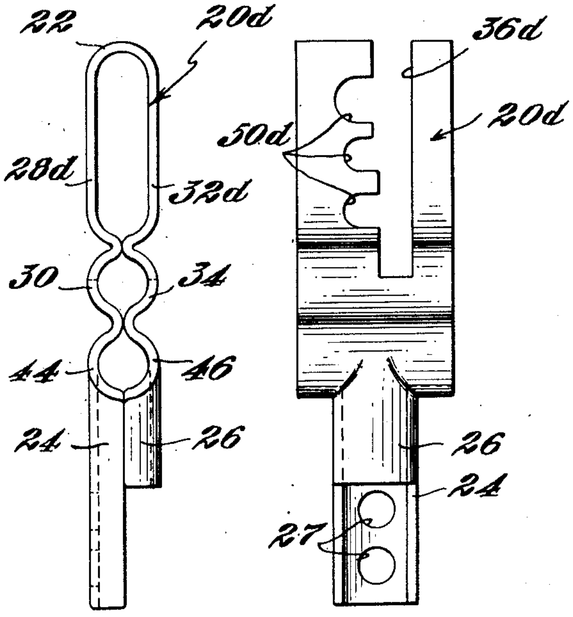
Figs. 11 and 12 are side elevation views of a modification of the embodiment shown in Fig. 10.

The terminal 20d, illustrated in Figs. 11 and 12, is provided with three pairs of loops so that it accomplishes a similar result. The upper loops 28d and 32d are elongated and the slotted aperture 36d extends therethrough into the center loops 30 and 34. An alternative arrangement of the notches 50d for accommodating the leads of components of different diameters to that shown in Fig. 10 is employed in the terminal 20d wherein the notches are all cut in one side of the aperture although it is to be understood that either configuration of notches can be used with either terminal.

It is also possible to use a serrated tapered slot 36e such as shown in the terminal 20e (Figs. 13 and 14) for securing components of various diameters. Although the wire diameters of electrical components of different manufacturers vary somewhat, there is a rough correlation between the diameters of the different components and their respective leads so that a tapered slot whose bottom is located approximately .093 inch from the surface of the terminal board and which tapers from a minimum width of .030 to a maximum width of .042 in a length of .267 inch has been found to space the components at a satisfactory distance from the board. When these dimensions are used the tines of the terminal are deformed slightly by the lead when the component is in position so that the lead is securely gripped by the teeth of the serrated edge of the slot 36e.

Figures 15, 16, 17, 18:
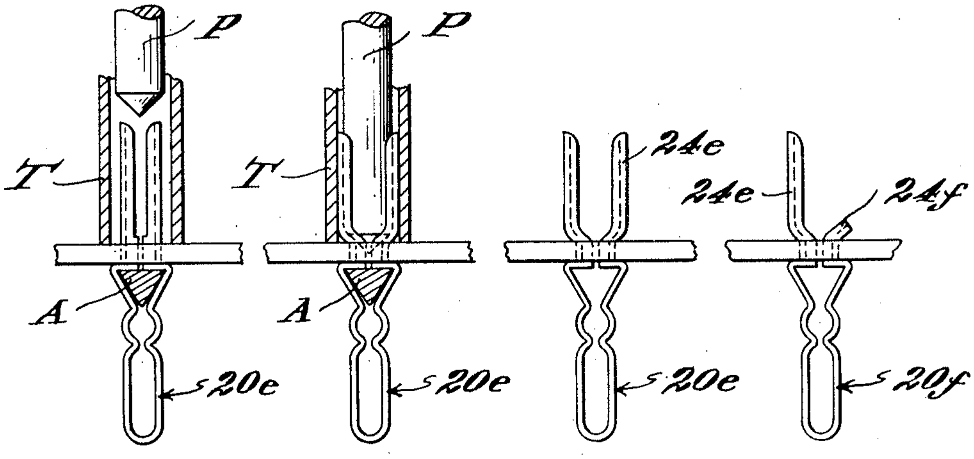
Figs. 15, 16 and 17 show the various steps by which the embodiment shown in Fig. 14 is mounted on a terminal board.
Fig. 18 is a modification of the embodiment shown in Fig. 14.

The bottommost loops 44e and 46e in this terminal are also modified so that they form a triangle whose bottom provides a better bearing surface against the terminal board as is shown in Fig. 17. The triangularly shaped lower loops also permit the insertion of a triangularly shaped anvil A (Figs. 15 and 16) which supports the terminal as it is being fastened to the terminal board as will be described in detail below.

The lower portion of the connector 20e comprises two tabs 24e of equal length which are separated by means of a slot and crowned outwardly to form a cylinder. The terminal 20e is fastened to the terminal board by inserting the tabs 24e through an aperture punched or otherwise cut in the terminal board and the terminal held in this position by the anvil A. A tool T formed as a hollow circular tube is then brought into position circumjacent the tabs on the opposite side of the terminal board. The diameter of the tube is made greater than the outer diameter of the tabs whereby as a punch P having a pointed lower end is brought down in a subsequent operation, the tabs are deformed outwardly against the tubular tool T thereby to form an offset or shoulder shaped as is shown in Fig. 17 which secures the terminal to the board. A modified form of the above described terminal designated 20f is shown in Fig. 18 wherein one of the tabs 24e is shorted as at 24f so that only the shoulder portion remains.

Figure 13:
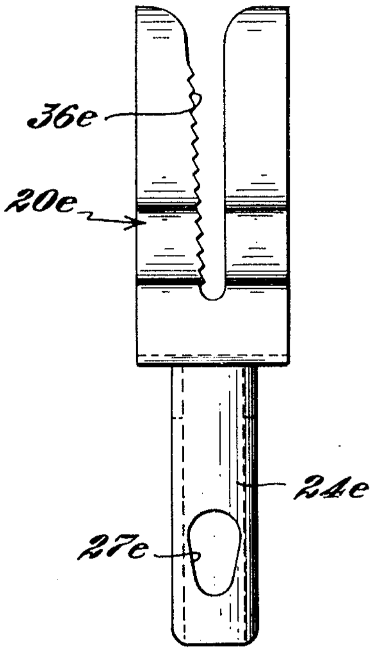
Figs. 13 and 14 are side elevation views of another embodiment adapted to receive leads from various sized components.
Figure 14:
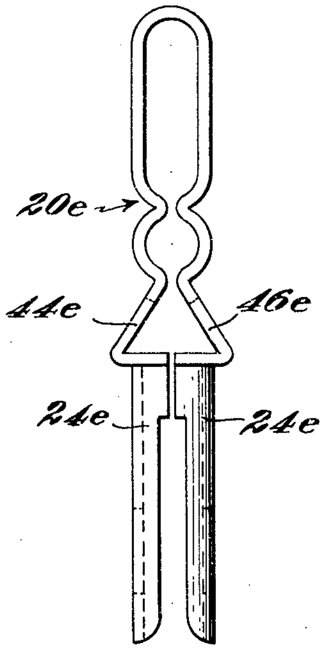

The aperture 27e (Fig. 13) for connecting the leads to the terminal 20e is generally oval in shape as is shown in Fig. 13. The diameters of the opposite ends of the aperture are so proportioned that a lead can be inserted through the larger end and pulled up towards the smaller end wherein it wedges securing the leads so that it can be wrapped around the terminal without the necessity of the use of pliers or other special tools.

It should be understood that the present disclosure is for the purpose of illustration only and that this invention includes all modifications and equivalents which fall within the scope of the appended claims.

I claim:

1. A soldering terminal for an electrical lead comprising a strip of conducting material folded back upon itself so that the two end portions lie adjacent each other, each of the end portions being crowned outwardly to impart rigidity to the terminal and permit the end portions to be formed into a shoulder for fastening the terminal to a terminal board, the folded portion being bifurcated to form an aperture for securing the lead during the soldering operation.

2. A soldering terminal for an electrical lead comprising a strip of conducting material folded back upon itself so that the two end portions lie adjacent each other, each of the end portions being deformed to impart rigidity to the terminal and permit the end portions to be formed into a shoulder for fastening the terminal to a terminal board, the folded portion being bifurcated to form an aperture for securing the lead during the soldering operation.

3. A soldering terminal for an electrical lead comprising a strip of conducting material folded back upon itself so that the two end portions lie adjacent each other, each of the end portions being deformed to impart rigidity to the terminal and permit the end portions to be formed into a shoulder for fastening the terminal to a terminal board, the folded portion being bifurcated to form an aperture proportioned so as to secure the lead during the soldering operation without the necessity of otherwise attaching the lead to the terminal.

4. A soldering terminal for an electrical lead comprising a strip of conducting material folded back upon itself so that the two end portions lie adjacent each other, each of the end portions being crowned outwardly to impart rigidity to the terminal and permit the end portions to be formed into a shoulder for fastening the terminal to a terminal board, the portion of each side of the strip between the fold and respective crowned end portions being bent outwardly into two adjacent loops thereby to form an ogdoad, the loops being bifurcated transversely to the direction of the fold to form an aperture for securing the lead during the soldering operation.

5. A soldering terminal for an electrical lead comprising a strip of conducting material folded back upon itself so that the two end portions lie adjacent each other, each of the end portions being crowned outwardly to impart rigidity to the terminal and permit the end portions to be formed into a shoulder for fastening the terminal to a terminal board, the portion of each side of the strip between the fold and respective crowned end portions being bent outwardly into two adjacent loops thereby to form an ogdoad, the loops being bifurcated transversely to the direction of the fold to form an aperture for securing the lead during the soldering operation, the radius of at least one pair of said loops being great enough so that a second lead can be inserted therebetween.

6. A soldering terminal for an electrical lead comprising a strip of conducting material folded back upon itself so that the two end portions lie adjacent each other, each of the end portions being crowned outwardly to impart rigidity to the terminal and permit the end portions to be formed into a shoulder for fastening the terminal to a terminal board, one of said end portions being provided with a lug to which a lead can be soldered, the portion of each side of the strip between the fold and respective crowned end portions being bent outwardly into two adjacent loops thereby to form an ogdoad, the loops being bifurcated transversely to the direction of the fold to form an aperture for securing the lead during the soldering operation.

7. A soldering terminal for the lead from an electrical circuit component comprising a strip of conducting material folded back upon itself so that the two end portions lie adjacent each other, each of the end portions being crowned outwardly to impart rigidity to the terminal and permit the end portions to be formed into an eyelet for fastening the terminal to a terminal board, the portion of each side of the strip between the fold and respective crowned end portions being bent outwardly into two adjacent loops thereby to form an ogdoad, the loops being bifurcated transversely to the direction of the fold to form a slotted aperture for securing the lead during the soldering operation, the portions of the strip forming one side of the slotted aperture being provided with a plurality of adjacent notches for accommodating the leads of components of various diameters.

8. A soldering terminal for an electrical lead comprising a strip of conducting material folded back upon itself so that the two end portions lie adjacent each other, each of the end portions being crowned outwardly to impart rigidity to the terminal and permit the end portions to be formed into a shoulder for fastening the terminal to a terminal board, one of said end portions being provided with a lug to which a lead can be soldered, the portion of each side of the strip between the fold and respective crowned end portion being bent outwardly into two adjacent loops, the loops being bifurcated transversely to the direction of the fold to form a tapered aperture, one side of which is serrated for securing the lead during the soldering operation.

9. A soldering terminal for the lead from an electrical circuit component comprising a strip of conducting material folded back upon itself so that the two end portions lie adjacent each other, each of the end portions being crowned outwardly to impart rigidity to the terminal and permit the end portions to be formed into an eyelet for fastening the terminal to a terminal board, the portion of each side of the strip between the fold and respective crowned end portions being bent outwardly into two or more adjacent loops, the loop adjacent the terminal board being substantially triangular in shape, the loops being bifurcated transversely to the direction of the fold to form a slotted tapered aperture for securing the lead during the soldering operation, the portions of the strip forming one side of the slotted aperture being serrated to accommodate the leads of components of various diameters.

MILTON ALDEN.

References Cited in the file of this patent

UNITED STATES PATENTS

| Number | Name | Date |
|---|---|---|
| 802,736 | Cook | Oct. 24, 1905 |
| 1,582,828 | Kuskin | Apr. 27, 1926 |
| 1,676,967 | Simon | July 10, 1928 |
| 1,808,335 | Aufiero | June 2, 1931 |
| 1,956,019 | Gilbert | Apr. 24, 1934 |
| 2,290,172 | Eby | July 21, 1942 |
| 2,337,692 | Todd | Dec. 28, 1943 |
| 2,369,541 | DelCamp | Feb. 13, 1945 |
| 2,405,554 | Barbour, Jr. | Aug. 13, 1946 |
| 2,433,358 | Garberding | Dec. 30, 1947 |
| 2,462,867 | Hubbell | Mar. 1, 1949 |
| 2,551,844 | Kueck | May 8, 1951 |